United States Patent
Oh

(10) Patent No.: US 7,868,674 B2
(45) Date of Patent: Jan. 11, 2011

(54) SEMICONDUCTOR DEVICE AND OPERATING METHOD THEREOF

(75) Inventor: Young-Hoon Oh, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 12/761,734

(22) Filed: Apr. 16, 2010

(65) Prior Publication Data

US 2010/0195423 A1 Aug. 5, 2010

Related U.S. Application Data

(62) Division of application No. 12/217,002, filed on Jun. 30, 2008, now Pat. No. 7,733,141.

(30) Foreign Application Priority Data

| Nov. 2, 2007 | (KR) | ............................. 2007-0111458 |
| Apr. 30, 2008 | (KR) | ............................. 2008-0040893 |

(51) Int. Cl.
  *H03L 7/06* (2006.01)
(52) U.S. Cl. ........................................ 327/158; 327/149
(58) Field of Classification Search ................. 327/149, 327/158
  See application file for complete search history.

(56) References Cited

U.S. PATENT DOCUMENTS

| 5,945,857 A * | 8/1999 | Havens ........................ 327/175 |
| 6,963,225 B2 | 11/2005 | Whetsel |
| 7,161,397 B2 | 1/2007 | Lee et al. |
| 7,180,346 B2 * | 2/2007 | Lee ............................. 327/175 |
| 7,282,977 B2 * | 10/2007 | Lee ............................. 327/175 |
| 7,282,978 B2 * | 10/2007 | Lee ............................. 327/175 |
| 7,365,583 B2 * | 4/2008 | Shin ........................... 327/158 |
| 7,567,103 B2 * | 7/2009 | Park et al. .................... 327/158 |
| 7,573,308 B2 * | 8/2009 | Kim ........................... 327/158 |
| 7,612,591 B2 * | 11/2009 | Kim ........................... 327/158 |
| 7,612,593 B2 * | 11/2009 | Kim et al. ................... 327/175 |
| 7,629,829 B2 * | 12/2009 | Lee ............................. 327/298 |

(Continued)

FOREIGN PATENT DOCUMENTS

JP  2002-042469  2/2002

(Continued)

*Primary Examiner*—Lincoln Donovan
*Assistant Examiner*—Adam D Houston
(74) *Attorney, Agent, or Firm*—Blakely, Sokoloff, Taylor & Zafman

(57) ABSTRACT

A delay locked loop (DLL) of a semiconductor device has a relatively small area and low current consumption while having a function of correcting a duty ratio. The semiconductor device includes a split unit configured to receive and split a reference clock to output a first clock corresponding to a first edge of the reference clock and a second clock corresponding to a second edge, a voltage generation unit configured to generate a first voltage corresponding to a duty ratio of the first clock and a second voltage corresponding to a duty ratio of the second clock, a voltage comparison unit configured to compare levels of the first and second voltages with each other, and a clock delay unit configured to receive one of the first and second clocks to delay the received clock of which delay amount is determined in response to an output signal of the voltage comparison unit.

27 Claims, 10 Drawing Sheets

U.S. PATENT DOCUMENTS

| | | | |
|---|---|---|---|
| 7,649,390 B2* | 1/2010 | Shin | 327/158 |
| 7,701,273 B2* | 4/2010 | Choi | 327/158 |
| 7,733,141 B2* | 6/2010 | Oh | 327/158 |
| 2007/0001726 A1* | 1/2007 | Lee | 327/175 |
| 2007/0013423 A1* | 1/2007 | Lee | 327/175 |
| 2007/0069781 A1* | 3/2007 | Kim et al. | 327/158 |
| 2007/0069782 A1* | 3/2007 | Shin | 327/158 |
| 2007/0080732 A1* | 4/2007 | Cho | 327/175 |
| 2008/0191757 A1* | 8/2008 | Choi | 327/149 |
| 2009/0058481 A1* | 3/2009 | Kim et al. | 327/175 |
| 2009/0115471 A1* | 5/2009 | Choi | 327/149 |
| 2009/0115475 A1* | 5/2009 | Oh | 327/158 |
| 2009/0278580 A1* | 11/2009 | Kim | 327/158 |
| 2009/0279580 A1 | 11/2009 | Kim | 327/158 |
| 2010/0073053 A1* | 3/2010 | Shin | 327/158 |
| 2010/0194458 A1* | 8/2010 | Oh | 327/158 |
| 2010/0195423 A1* | 8/2010 | Oh | 365/194 |
| 2010/0201414 A1* | 8/2010 | Oh | 327/158 |

FOREIGN PATENT DOCUMENTS

| | | |
|---|---|---|
| KR | 10-2003-0002130 | 1/2003 |
| KR | 10-0701423 B1 | 3/2007 |
| KR | 10-2007-0046341 A | 5/2007 |
| KR | 2007-0104727 A | 10/2007 |
| KR | 1020090045569 A | 5/2009 |

* cited by examiner

US 7,868,674 B2

SEMICONDUCTOR DEVICE AND OPERATING METHOD THEREOF

CROSS-REFERENCE TO RELATED APPLICATIONS

The present patent application is a Divisional application claiming the benefit of application Ser. No. 12/217,002, filed Jun. 30, 2008 now U.S. Pat. No. 7,733,141.

The present invention claims priority of Korean patent application numbers 10-2007-0111458 and 10-2008-0040893, respectively filed on Nov. 2, 2007 and Apr. 30, 2008, which are incorporated by reference in their entirety.

BACKGROUND OF THE INVENTION

The present invention relates to a delay locked loop (DLL) of a semiconductor device including a circuit for correcting a duty ratio of an output signal, and more particularly, to a DLL of a semiconductor device with a relatively small occupation area and relatively low current consumption even while having a function of correcting a duty ratio.

Generally, in a synchronous semiconductor memory device such as a double data rate (DDR) synchronous DRAM (SDRAM), input/output data must be always synchronized with a reference clock.

The reference clock means an external clock (CLK and CLKB) inputted from an external device, for example, a memory controller. Therefore, the meaning the synchronous semiconductor memory device must transmit data in synchronization with the reference clock is that an output point of time of the data transmitted from the synchronous semiconductor memory device must be exactly equal to an edge or center of the external clock (CLK and CLKB).

As known from asynchronous semiconductor memory devices, however, data are not always outputted in synchronization with the external clock (CLK and CLKB) even though an output command and the external clock (CLK and CLKB) are applied to general semiconductor memory devices.

The reasons that the data are not synchronized with the external clock (CLK and CLKB) in such a semiconductor memory device are as followings.

First, it is assumed that the external clock (CLK and CLKB) buffered through an input buffering circuit in the semiconductor memory device is referred to as an internal clock. The internal clock may change its phase while passing through various internal elements, e.g., a control circuit, a peripheral circuit and a cell array, of the semiconductor memory device. Accordingly, the internal clock is not synchronized with the external clock (CLK and CLKB) when the internal clock is outputted to the outside through an output buffering circuit.

Since the output data of the semiconductor memory device are outputted in synchronization with the internal clock, there is also a phase difference between the data and the external clock (CLK and CLKB), which corresponds to a phase difference between the internal clock and the external clock (CLK and CLKB). That is, the data outputted from the semiconductor memory device are asynchronous with the external clock (CLK and CLKB).

Therefore, in order to output the input/output data in synchronization with the external clock (CLK and CLKB) which is used as a reference clock in the semiconductor memory device, the internal clock must be inversely compensated for a delay time that the internal clock applied to an output pad is delayed with respect to the inputted external clock (CLK and CLKB) due to operation of the semiconductor memory device. Through such inverse compensation, the phase of the internal clock can be synchronized with the phase of the external clock (CLK and CLKB).

A phase locked loop (PLL) and a delay locked loop (DLL) are representatively used as a circuit for synchronizing the internal clock with the external clock (CLK and CLKB) by inversely compensating for the delay time that the phase of the internal clock is delayed.

The PLL is used for synchronizing a frequency and a phase at the same time using a frequency multiplication function when there is a frequency difference between the external clock, which is a reference clock mainly inputted from the outside, and the internal clock, which is used in the semiconductor memory device.

The DLL is used for synchronizing only a phase when the external clock is equal in frequency to the internal clock.

Comparing only characteristics of the PLL and the DLL themselves with each other, the PLL seems to be more popularly used than the DLL because the PLL has a supplementary function, i.e., frequency multiplication function. Actually, however, the DLL is more popularly used than the PLL in the semiconductor memory device.

There may be several reasons for this, a representative one of which is that the DLL has such advantageous merits that the DLL is less affected by noise and can be formed in a smaller area than the PLL.

FIG. 1 is a block diagram illustrating a conventional DLL of a semiconductor device.

Referring to FIG. 1, the conventional DLL of the semiconductor device includes a delay locking unit 100, a phase detection unit 120, and a phase mixing unit 140. The delay locking unit 100 generates a first delay clock RISING_CLK corresponding to a first clock edge, e.g., rising edge of a reference clock REF_CLK, and a second delay clock FALLING_CLK corresponding to a second clock edge, e.g., falling edge of the reference clock REF_CLK so as to achieve a delay-locking. The phase detection unit 120 detects a phase difference between the first delay clock RISING_CLK and the second delay clock FALLING_CLK to output a weight select signal WR_SEL. The phase mixing unit 140 mixes phases of the first and second delay clocks RISING_CLK and FALLING_CLK by applying a weight corresponding to the weight select signal WR_SEL at points of time when the first and second delay clocks RISING_CLK and FALLING_CLK are delay locked, thereby outputting DLL clocks DLL_CLK_USE and DLL_CLK_DUMMY. The conventional DLL further includes a split unit 110A and a dummy split unit 110B, which split phases of the DLL clock DLL_CLK_USE and DLL_CLK_DUMMY to generate first and second split clocks RCLKDLL and FCLKDLL. The dummy split unit 110B has the same configuration as the split unit 110A but does not operate actually.

The phase mixing unit 140 includes a delay lock enable signal generator 146, a mixing controller 142, a DCC phase mixer 144 and a dummy DCC phase mixer 145. The delay lock enable signal generator 146 generates a delay lock enable signal DCC_EN of which a logic level is determined in response to a first delay lock signal LOCK_STATE_R and a second delay lock signal LOCK_STATE_F. The first delay lock signal LOCK_STATE_R corresponds to whether the first delay clock RISING_CLK is delay locked or not, and the second delay lock signal LOCK_STATE_F corresponds to whether the second delay clock FALLING_CLK is delay locked or not. The mixing controller 142 generates a mixing control signal CTRL for controlling a mixing ratio of the first and second delay clocks RISING_CLK and FALLING_CLK in response to the weight select signal WR_SEL when the delay lock enable signal DCC_EN is activated. The DCC phase mixer 144 mixes phases of the first and second delay clocks RISING_CLK and FALLING_CLK at the mixing ratio corresponding to the mixing control signal CTRL to thereby output the DLL clock DLL_CLK_USE. The dummy DCC phase mixer 145 has the same configuration as the DCC phase mixer 144 but does not operate actually.

The delay locking unit 100 includes a first phase delay 102, a second phase delay 104, a first delay replica model 103 and a second delay replica model 105 for achieving a delay-locking. The first phase delay 102 delays a first clock CLK_IN_R corresponding to a first clock edge, e.g., rising edge, of the reference clock REF_CLK by a delay time determined through comparing phases of the reference clock REF_CLK and a first feedback clock FEB_CLK1 with each other, thereby outputting the first delay clock RISING_CLK. The second phase delay 104 delays a second clock CLK_IN_F corresponding to a second clock edge, e.g., falling edge, of the reference clock REF_CLK by a delay time determined through comparing phases of the reference clock REF_CLK and a second feedback clock FEB_CLK2 with each other, thereby outputting the second delay clock FALLING_CLK. The first delay replica model 103 outputs the first feedback signal FEB_CLK1 by applying an actual delay condition of the first clock CLK_IN_R to the first delay clock RISING_CLK. The second delay replica model 105 outputs the second feedback signal FEB_CLK2 by applying an actual delay condition of the second clock CLK_IN_F to the second delay clock FALLING_CLK. The delay locking unit 100 further includes a clock buffer 106 configured to buffer the external clocks CLK and CLKB inputted from the outside to output the reference clock REF_CLK and the first and second clocks CLK_IN_R and CLK_IN_F.

The first phase delay 102 includes a first phase comparator 1022 and a first delay line 1024. The first phase comparator 1022 compares the phase of the first feedback clock FEB_CLK1 with that of the reference clock REF_CLK to generate a first delay control signal DELAY_CON1. The first delay line 1024 delays the first clock CLK_IN_R by a delay time determined corresponding to the first delay control signal DELAY_CON1 to output the first delay clock RISING_CLK.

The second phase delay 104 includes a second phase comparator 1042 and a second delay line 1044. The second phase comparator 1042 compares the phase of the second feedback clock FEB_CLK2 with that of the reference clock REF_CLK to generate a second delay control signal DELAY_CON2. The second delay line 1044 delays the second clock CLK_IN_F by a delay time determined corresponding to the second delay control signal DELAY_CON2 to output the second delay clock FALLING_CLK.

Operation of the conventional DLL having the above configuration will be described below.

The operation of the delay locking unit 100 of the conventional DLL is mainly divided into two operation modes, of which one is an operation in a state before a delay is locked and the other is an operation in a state after a delay is locked. For convenience in description, the state before the delay is locked will be referred to as a before-delay-locked state, and the state after the delay is locked will be referred to as an after-delay-locked state, hereinafter. As described above, the operations in the before-delay-locked state and the after-delay-locked state are determined according to whether the phases of the first and second delay clocks RISING_CLK and FALLING_CLK outputted from the delay locking unit 100 fall within a predetermined range. That is, when the phases of the first and second delay clocks RISING_CLK and FALL-ING_CLK fall out of the predetermined range, this state may be referred to as the before-delay-locked state. On the contrary, when the phases of the first and second delay clocks RISING_CLK and FALLING_CLK fall within the predetermined range, this state may be referred to as the after-delay-locked state.

Specifically, at a point of time when the DLL of the semiconductor device starts operating in the before-delay-locked state, the first and second clocks CLK_IN_R and CLK_IN_F are the same as the reference clock REF_CLK because the reference clock REF_CLK and the first and second clock CLK_IN_R and CLK_IN_F are all generated by buffering the external clocks CLK and CLKB.

However, the first and second clocks CLK_IN_R and CLK_IN_F are delayed by predetermined initial delay times and have opposite phases to each other, respectively, while passing through each of the first and second delay lines 1024 and 1044. Therefore, there are phase differences between the reference clock REF_CLK, and the first and second delay clocks RISING_CLK and FALLING_CLK.

That is, the first delay clock RISING_CLK has a rising edge at a point of time after a lapse of the initial delay time from a point of time corresponding to a first edge of the reference clock REF_CLK. Herein, the first edge of the reference clock REF_CLK is assumed to be a rising edge. The second delay clock FALLING_CLK has a falling edge at a point of time after a lapse of the initial delay time from a point of time corresponding to a second edge of the reference clock REF_CLK. Herein, the second edge of the reference clock REF_CLK is assumed to be a falling edge.

Thereafter, the first delay clock RISING_CLK is delayed by a delay time set in the first delay replica model 103 and then outputted while the DLL of the semiconductor device starts operating. The delay time, i.e., delay amount, set in the first replica model 103 is equal to the delay time of the first clock CLK_IN_R that is delayed while passing through various internal elements, e.g., a control circuit, a peripheral circuit and a cell array, of the semiconductor memory device.

Likewise, the second delay cock FALLING_CLK is delayed by a delay time set in the second delay replica model 105 and then outputted. The delay time of the second delay clock FALLING_CLK by the second delay replica model 105 is equal to the delay time of the first delay clock RISING_CLK by the first delay replica model 103. In other words, the delay time of the first clock CLK_IN_R delayed while passing through the internal elements of the semiconductor memory device is equal to the delay time of the second clock CLK_IN_F delayed while passing through the internal elements of the semiconductor memory device.

In FIG. 1, however, it can be appreciated that the first and second delay clocks RISING_CLK and FALLING_CLK are not inputted to the first and second delay replica models 103 and 105 but the DLL clock DLL_CLK_USE and the dummy DLL clock DLL_CLK_DUMMY are inputted to the first and second delay replica models 103 and 105, respectively. This is because the phase mixing unit 140 does not operate in the before-delay-locked state but operates in only the after-delay-locked state.

That is, the phase mixing unit 140 serves as a bypass in the before-delay-locked state to thereby output an input signal as its entirety. However, the phase mixing unit 140 mixes phases of input signals in the after-delay-locked state.

Therefore, in the before-delay-locked state, it can be appreciated that the first and second delay clocks RISING_CLK and FALLING_CLK inputted to the phase mixing unit 140 are the same as the DLL clock DLL_CLK_USE and the dummy DLL clock DLL_CLK_DUMMY outputted from the phase mixing unit 140, respectively.

The conventional DLL of the semiconductor device performs an operation for changing clocks in the before-delay-locked state until existing the before-delay-locked state.

First, a rising edge of the first delay clock RISING_CLK outputted from the first delay line 1024 is delay locked, i.e., synchronized, with a rising edge of the reference clock REF_CLK by appropriately controlling the first delay line 1024 such that the first clock CLK_IN_R having the initial delay time is further delayed by a first predetermined time.

At the same time, a rising edge of the second delay clock FALLING_CLK outputted from the second delay line 1044 is delay locked, i.e., synchronized, with the rising edge of the reference clock REF_CLK by appropriately controlling the second delay line 1044 such that the second clock CLK_IN_F having the initial delay time is further delayed by a second predetermined time.

The first delay line 1024 delaying the first clock CLK_IN_R differs in delay amount from the second delay line 1044 delaying the second clock CLK_IN_F. That is, the first predetermined time and the second predetermined time are different from each other.

As described above, the rising edge of the first delay clock RISING_CLK is synchronized with the rising edge of the reference clock REF_CLK so that the first delay lock signal LOCK_STATE_R is activated, and the rising edge of the second delay clock FALLING_CLK is synchronized with the rising edge of the reference clock REF_CLK so that the second delay lock signal LOCK_STATE_F is activated. Consequently, the delay lock enable signal DCC_EN is activated so that the before-delay-locked state is terminated.

Afterwards, the DLL of the semiconductor device enters an operation mode in the after-delay-locked state. In the after-delay-locked state, the phase mixing unit 140 does not serve as a bypass but mixes phases of the inputted first and second delay clocks RISING_CLK and FALLING_CLK, thus correcting a duty ratio of the DLL clock DLL_CLK_USE outputted from the phase mixing unit 140 at 50 to 50.

In consideration of the reason that the DLL exists in the semiconductor device as aforementioned, the DLL is required for synchronizing the internal clock with the external clock by inversely compensating for a delay time that the phase of the internal clock is delayed due to the operation of the semiconductor device.

That is, when exiting the before-delay-locked state, the rising edges of the DLL clocks DLL_CLK_USE and DLL_CLK_DUMMY, i.e., the internal clock, are in synchronization with the rising edge of the reference clock REF_CLK, i.e., the external clock. Herein, the DLL clocks DLL_CLK_USE and DLL_CLK_DUMMY may be equal to the first and second delay clocks RISING_CLK and FALLING_CLK at a point of time when the before-delay-locked state is terminated. Therefore, operation of the DLL must be stopped at the same time when the before-delay-locked state is terminated.

However, while an early semiconductor device outputs one data within one period of the internal clock, a state-of-the art semiconductor device outputs two or more data within one period of the internal clock.

For example, there have been developed several semiconductor memory devices including synchronous semiconductor memory devices such as DDR SDRAM, DDR2 SDRAM and DDR3 SDRAM, in which one data is outputted at a rising edge of the DLL clock DLL_CLK_USE and another data is also outputted at a falling edge of the DLL clock DLL_CLK_USE.

If a logic high level section of the internal clock from the rising to edge to the falling edge is relatively long but a logic low level section from falling edge to the rising edge is relatively short, a time is enough to input/output data during the logic high level section but a time is not enough to input/output data during the logic low level section. This may lead to an error in inputting/outputting data.

Therefore, operation of correcting the duty ratio of the DLL clock DLL_CLK_USE, internal clock, must be performed at the end of the DLL.

Specific operation of the mixing controller 142 in the after-delay-locked state will be described below. A logic high level section of the first delay clock RISING_CLK is equal to a logic high level section of the reference clock REF_CLK, and a logic high level section of the second delay clock FALLING_CLK is equal to a logic high level section of the reference clock REF_CLK. Since the rising edges of the first and second delay clocks RISING_CLK and FALLING_CLK are synchronized in the before-delay-locked state, the phase detection unit 120 compares the falling edge of the first delay clock RISING_CLK with the falling edge of the second delay clock FALLING_CLK to thereby output the weight select signal WR_SEL.

Thereafter, the mixing controller 142 appropriately controls the mixing control signal CTRL such that the DCC phase mixer 144 mixes the phases of the first and second delay clocks RISING_CLK and FALLING_CLK with a weight corresponding to the weight select signal WR_SEL.

Through the above-described procedure, the DCC phase mixer 144 generates the DLL clock DLL_CLK_USE having a duty ratio of 50 to 50.

Afterwards, the split unit 110A splits the DLL clock DLL_CLK_USE with a corrected duty ratio of 50 to 50, thus generating a first split clock RCLKDLL corresponding to the first edge, e.g., rising edge, of the DLL clock DLL_CLK_USE and a second split clock FCLKDLL corresponding to the second edge, e.g., falling edge, of the DLL clock DLL_CLK_USE.

At this time, it is unnecessary for the dummy DCC phase mixer 145 and the dummy phase split unit 110B to be operated. This is because the dummy DCC phase mixer 145 and the dummy phase split unit 110B serve as a load having resistance corresponding to resistance of elements, e.g., inverts and transistors, in the dummy DCC phase mixer 145 and the dummy phase split unit 1108, so that they are used for bypassing the first and second delay clocks RISING_CLK and FALLING_CLK inputted to the phase mixing unit 140 under the same transmission condition in the before-delay-locked state. Accordingly, the dummy DCC phase mixer 145 and the dummy phase split unit 1108 may not operate in the after-delay-locked loop except that it performs only a bypass operation in the before-delay-locked state.

Through the operations in the before-delay-locked state and the after-delay-locked state of the conventional DLL, the DLL clock DLL_CLK_USE accomplishing two objects below is generated.

A first object to inversely compensate for the time delay of the Internal clock for synchronizing output data with the external clock has been accomplished in the before-delay-locked state of the DLL.

A second object is not to output data at only the first edge, e.g., rising edge, of the internal clock but to output data both the first edge and the second edge, e.g., falling edge, by accurately correcting the duty ratio of the internal clock at 50 to 50. Therefore, the second object has been accomplished in the after-delay-locked state.

To accomplish the two objects as above, the conventional DLL of the semiconductor device in FIG. 1 operates in dual loop manner so that some elements of the DLL are not operated substantially but left untended according to whether the operation mode is in the before-delay-locked state or the after-delay-locked state.

For reference, a great difference between the DLL using a dual loop and the DLL using a single loop is number of the internal clocks. That is, the DLL using the single loop uses one internal clock when synchronizing the internal clock with the external clock, whereas the DLL using the double loop uses two internal clocks. This has been publicly well known, and thus further description for it will be omitted herein.

For example, the mixing controller 140 cannot perform the correction operation of the duty ratio in the before-delay-locked state but bypasses the input signal as its entirety. Because the bypassing means just connecting a line, it can be understood that the mixing controller 140 does not operate substantially in the before-delay-locked state.

Further, even during the intrinsic duty correction in the after-delay-locked state, the mixing controller 140 does not use the dummy DCC phase mixer 145 which has been used as a load having predetermined resistance during the bypass operation in the before-delay-locked state.

In the delay locking unit 100, the elements related to the first delay clock RISING_CLK, e.g., first phase delay 102 and the first delay replica model 103, are still used in both the before-delay-locked state and the after-delay-locked state, whereas operations of the elements related to the second delay clock FALLING_CLK, e.g., second phase delay 104 and the second delay replica model 105, are not meaningful in the after-delay-locked state.

This is because the DLL clock DLL_CLK_USE is a clock corresponding to the first delay clock RISING_CLK. In the case where the DLL clock DLL_CLK_USE is a clock corresponding to the second delay clock FALLING_CLK, the operations of the elements related to the first delay clock RISING_CLK, e.g., first phase delay 102 and the first delay replica model 103, may not be meaningful in the after-delay-locked state.

Also, because the dummy phase split unit 110B, which is connected to an output terminal of the phase mixing unit 140 and compared to the split unit 110A for splitting the DLL clock DLL_CLK_USE, is used as a load having predetermined resistance during a bypass operation in the before-delay-locked state, the dummy phase split unit 110B is not used in the after-delay-locked state.

In this way, even though some elements of the DLL are not operated substantially but left untended, the conventional DLL employing the dual loop in FIG. 1 can be normally operated only if all the elements are included.

If, however, the DLL employs the single loop in order to overcome a problem of the conventional DLL employing the dual loop, it is easy to accomplish the first object to inversely compensate for the time delay of the internal clock for synchronizing output data with the external clock but there is no way to accomplish the second object to accurately maintain the duty ratio of the internal clock at 50 to 50.

Accordingly, in the conventional art, the DLL employing the dual loop has been used in the semiconductor device inevitably, leading to a problem of large occupation area of the DLL.

Therefore, as the semiconductor device is shrinking in size, the application of the DLL employing the dual loop makes it difficult to miniaturize the semiconductor device.

In addition, even in a state that some elements of the DLL employing the dual loop are not operated substantially but left untended, current still flows into those elements, thus giving rise to unnecessary current consumption.

Consequently, as the semiconductor device with lower power consumption is being developed, the application of the DLL with the dual loop makes it difficult to achieve the semiconductor device with low power performance.

SUMMARY OF THE INVENTION

Embodiments of the present invention are directed to providing a delay locked loop (DLL) of a semiconductor device with a relatively small area and low current consumption while having a function of correcting a duty ratio.

In accordance with an aspect of the present invention, there is provided a semiconductor device, which includes a delay locking unit configured to compare a phase of a feedback clock with a phase of a reference clock for achieving a delay-locking, and configured to delay an internal clock corresponding to a clock edge of the reference clock by a delay time corresponding to a comparison result to output a delay locked loop (DLL) clock, a split unit configured to receive and split the DLL clock to output a first clock corresponding to a first edge of the DLL clock and a second clock corresponding to a second edge, a voltage generation unit configured to generate a first voltage corresponding to a duty ratio of the first clock and a second voltage corresponding to a duty ratio of the second clock, a voltage comparison unit configured to compare levels of the first and second voltages with each other, and a clock delay unit configured to receive one of the first and second clocks to delay the received clock of which delay amount is determined in response to an output signal of the voltage comparison unit.

In accordance with an aspect of the present invention, there is provided a semiconductor device, which includes a split unit configured to receive and split a reference clock to output a first clock corresponding to a first edge of the reference clock and a second clock corresponding to a second edge, a voltage generation unit configured to generate a first voltage corresponding to a duty ratio of the first clock and a second voltage corresponding to a duty ratio of the second clock, a voltage comparison unit configured to compare levels of the first and second voltages with each other, and a clock delay unit configured to receive one of the first and second clocks to delay the received clock of which delay amount is determined in response to an output signal of the voltage comparison unit.

In accordance with an aspect of the present invention, there is provided an operating method of a semiconductor device, which includes generating a DLL clock by comparing a phase of a feedback clock with a phase of a reference clock for achieving a delay-locking, and delaying an internal clock corresponding to a clock edge of the reference clock by a delay time corresponding to a comparison result, splitting the DLL clock to output a first clock corresponding to a first edge of the DLL clock and a second clock corresponding to a second edge, generating a first voltage corresponding to a duty ratio of the first clock and a second voltage corresponding to a duty ratio of the second clock, comparing levels of the first and second voltages with each other, and delaying one of the first and second clocks to output the delayed clock of which delay amount is determined in response to a comparison signal.

DESCRIPTION OF SPECIFIC EMBODIMENTS

Hereinafter, a semiconductor device and an operating method thereof in accordance with the present invention will be described in detail with reference to the accompanying drawings.

Figure 2:
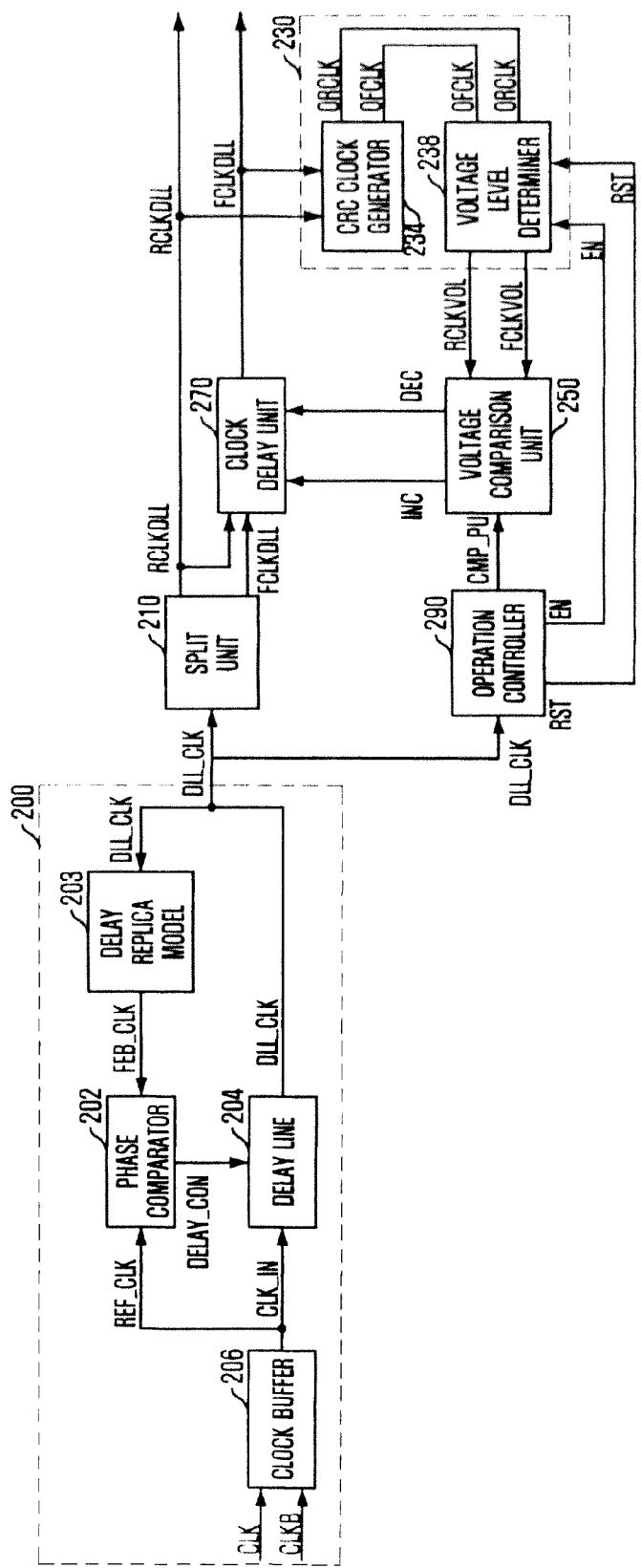
FIG. 2 is a block diagram of a DLL of a semiconductor device in accordance with an embodiment of the present invention.

FIG. 2 is a block diagram of a delay locked loop (DLL) of a semiconductor device in accordance with an embodiment of the present invention.

Referring to FIG. 2, the DLL of the semiconductor device in accordance with the present invention includes a delay locking unit 200 for achieving a delay-locking, a split unit 210, a voltage generation unit 230, a voltage comparison unit 250 and a clock delay unit 270. The delay locking unit 200 compares a phase of a feedback clock FEB_CLK with that of a reference clock REF_CLK, and delays an internal clock CLK_IN corresponding to a clock edge, e.g., a rising edge or a falling edge, of the reference clock REF_CLK by a delay time corresponding to the comparison result, thereby outputting a DLL clock DLL_CLK. The split unit 210 splits the DLL clock DLL_CLK to output a first clock RCLKDLL corresponding to a first edge, e.g., rising edge, of the DLL clock and a second clock FCLKDLL corresponding to a second edge, e.g., falling edge. The voltage generation unit 230 generates a first voltage RCLKVOL corresponding to a duty ratio of the first clock RCLKDLL and a second voltage FCLKDLL corresponding to a duty ratio of the second clock FCLKDLL. The voltage comparison unit 250 compares levels of the first and second voltages RCLKDLL and FCLKDLL with each other. The clock delay unit 270 receives one of the first and second clocks RCLKDLL and FCLKDLL to delay the received clock of which delay amount is determined in response to output signals INT and DEC of the voltage comparison unit 250. In addition, the DLL of the present invention further includes an operation control unit 290 configured to generate a reset signal RST and an enable signal EN for controlling the voltage generation unit 230, and to generate a comparison control signal CMP_PU for controlling the voltage comparison unit 250, in response to the DLL clock DLL_CLK.

The voltage generation unit 230 includes a CRC clock generator 234 and a voltage level determiner 238. The CRC clock generator 234 generates a first CRC clock ORCLK that is activated in response to a first edge, e.g., rising edge, of the first clock RCLKDLL and deactivated in response to a first edge, e.g., rising edge, of the second clock FCLKDLL, and also generates a second CRC clock OFCLK that is activated in response to the first edge, e.g., rising edge, of the second clock FCLKDLL and deactivated in response to the first edge, e.g., rising edge, of the first clock RCLKDLL. The voltage level determiner 238 outputs a first voltage RCLKVOL of which a level is determined corresponding to a duty ratio of the first CRC clock ORCLK, and a second voltage FCLKVOL of which a level is determined corresponding to a duty ratio of the second CRC clock OFCLK.

The delay locking unit 200 includes a buffer 206, a phase comparator 202, a delay line 204 and a delay replica model 203. The buffer 206 buffers external clocks CLK and CLKB to generate the reference clock REF_CLK. The phase comparator 202 compares the phase of the feedback clock FEB_CLK with the phase of the reference clock REF_CLK. The delay line 204 delays the internal clock CLK_IN corresponding to a clock edge, e.g., rising edge or falling edge, of the reference clock REF_CLK to thereby output the DLL clock DLL_CLK, of which delay amount is determined in response to an output signal DELAY_CON of the phase comparator 202. The delay replica model 203 outputs the feedback clock FEB_CLK by applying an actual delay condition of the internal clock CLK_IN to the DLL lock DLL_CLK.

Figure 3:
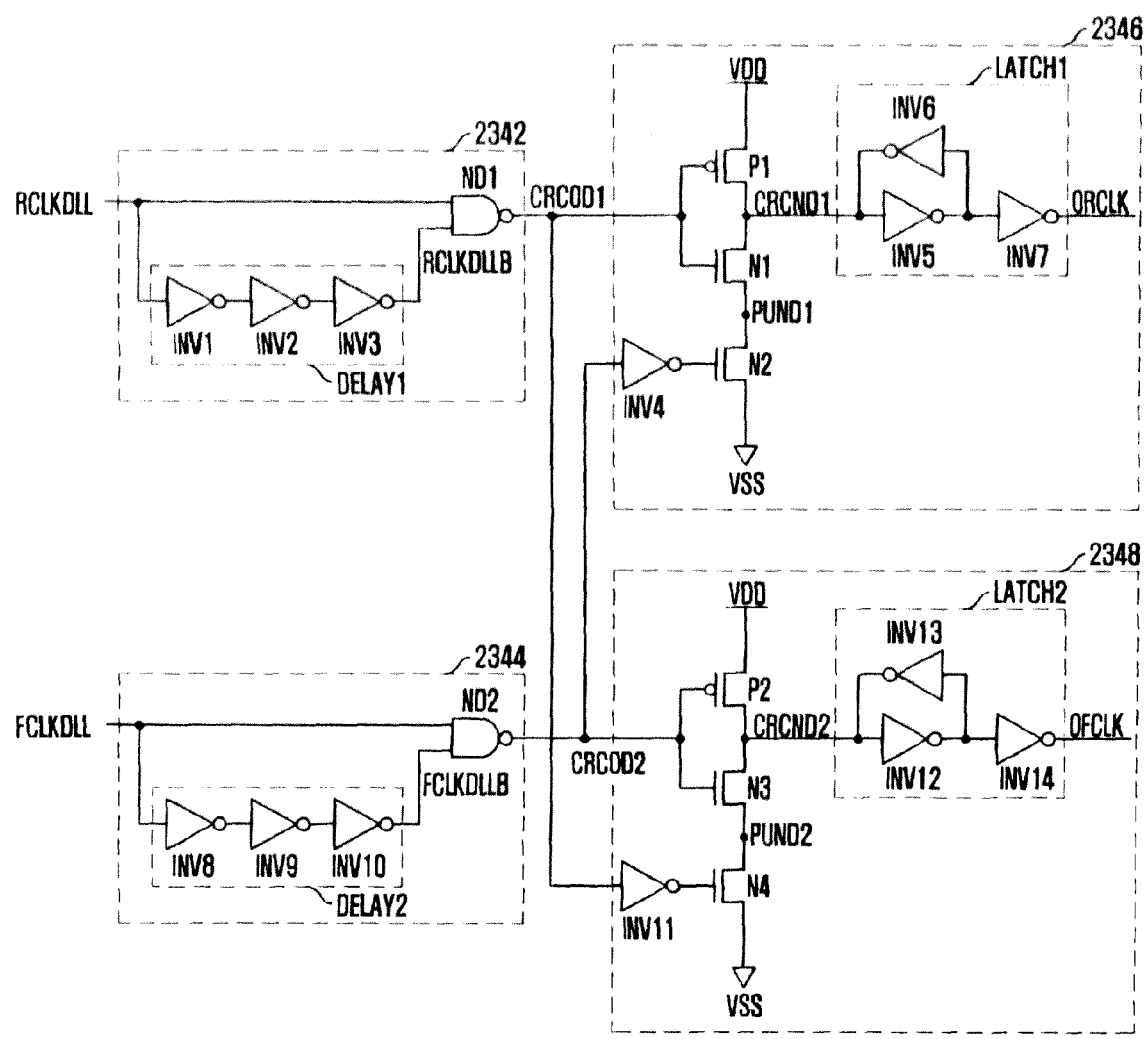
FIG. 3 is a circuit diagram illustrating a CRC clock generator provided in a voltage generation unit of the DLL of the semiconductor device in FIG. 2 in accordance with an embodiment of the present invention.

FIG. 3 is a circuit diagram illustrating the CRC clock generator 234 provided in the voltage generation unit 230 of the DLL of the semiconductor device in FIG. 2 in accordance with an embodiment of the present invention.

Referring to FIG. 3, the CRC clock generator 234 provided in the voltage generation unit 230 of the DLL of the semiconductor device in accordance with an embodiment of the present invention includes a first detector 2342, a second detector 2344, a first CRC clock output unit 2346 and a second CRC clock output unit 2348. The first detector 2342 detects the first edge, e.g., rising edge, of the first clock RCLKDLL and thus generates a first toggling signal CRCOD1. The second detector 2344 detects the first edge, e.g., rising edge, of the second clock FCLKDLL and thus generates a second toggling signal CRCOD2. The first CRC clock output unit 2346 outputs the first CRC clock ORCLK that is activated in response to the first toggling signal CRCOD1 and deactivated in response to the second toggling signal CRCOD2. The second CRC clock output unit 2348 outputs the second CRC clock OFCLK that is activated in response to the second toggling signal CRCOD2 and deactivated in response to the first toggling signal CRCOD1.

The first detector 2342 includes a delay DELAY1 configured to delay the first clock RCLKDLL by a predetermined delay time and invert the phase of the first clock RCLKDLL, and a NAND gate ND1 configured to perform a NAND operation on the first clock RCLKDLL and an output clock RCLKDLLB of the delay DELAY1 to output the first toggling signal CRCOD1.

Likewise, the second detector 2344 includes a delay DELAY2 configured to delay the second clock FCLKDLL by a predetermined delay time and invert the phase of the second clock FCLKDLL, and a NAND gate ND2 configured to perform a NAND operation on the second clock FCLKDLL and an output clock FCLKDLLB of the delay DELAY2 to output the second toggling signal CRCOD2.

The first CRC clock output unit 2346 includes a PMOS transistor P1, a first NMOS transistor N1, a second NMOS transistor N2 and a latch LATCH1. The PMOS transistor P1 is configured with a source terminal connected to a power voltage (VDD) terminal, a drain terminal connected to a CRC clock output terminal CRCND1, and a gate receiving the first toggling signal CRCOD1. The first NMOS transistor N1 is configured with a drain terminal connected to the CRC clock output terminal CRCND1, a source terminal connected to a pull-down control node PUND1, and a gate receiving the first toggling signal CRCOD1. The second NMOS transistor N2 is configured with a drain terminal connected to the pull-down control node PUND1, a source terminal connected to a ground voltage (VSS) terminal, and a gate receiving an inversion signal of the second toggling signal CRCOD2. The latch LATCH1 prevents the CRC clock output terminal CRCND1 from floating.

The second CRC clock output unit 2348 includes a PMOS transistor P2, a first NMOS transistor N3, a second NMOS transistor N4 and a latch LATCH2. The PMOS transistor P2 is configured with a source terminal connected to the power voltage (VDD) terminal, a drain terminal connected to a CRC clock output terminal CRCND2, and a gate receiving the second toggling signal CRCOD2. The first NMOS transistor N3 is configured with a drain terminal connected to the CRC clock output terminal CRCND2, a source terminal connected to a pull-down control node PUND2, and a gate receiving the second toggling signal CRCOD2. The second NMOS transistor N4 is configured with a drain terminal connected to the pull-down control node PUND2, a source terminal connected to the ground voltage (VSS) terminal, and a gate receiving an inversion signal of the first toggling signal CRCOD1. The latch LATCH2 prevents the CRC clock output terminal CRCND2 from floating.

Figure 4:
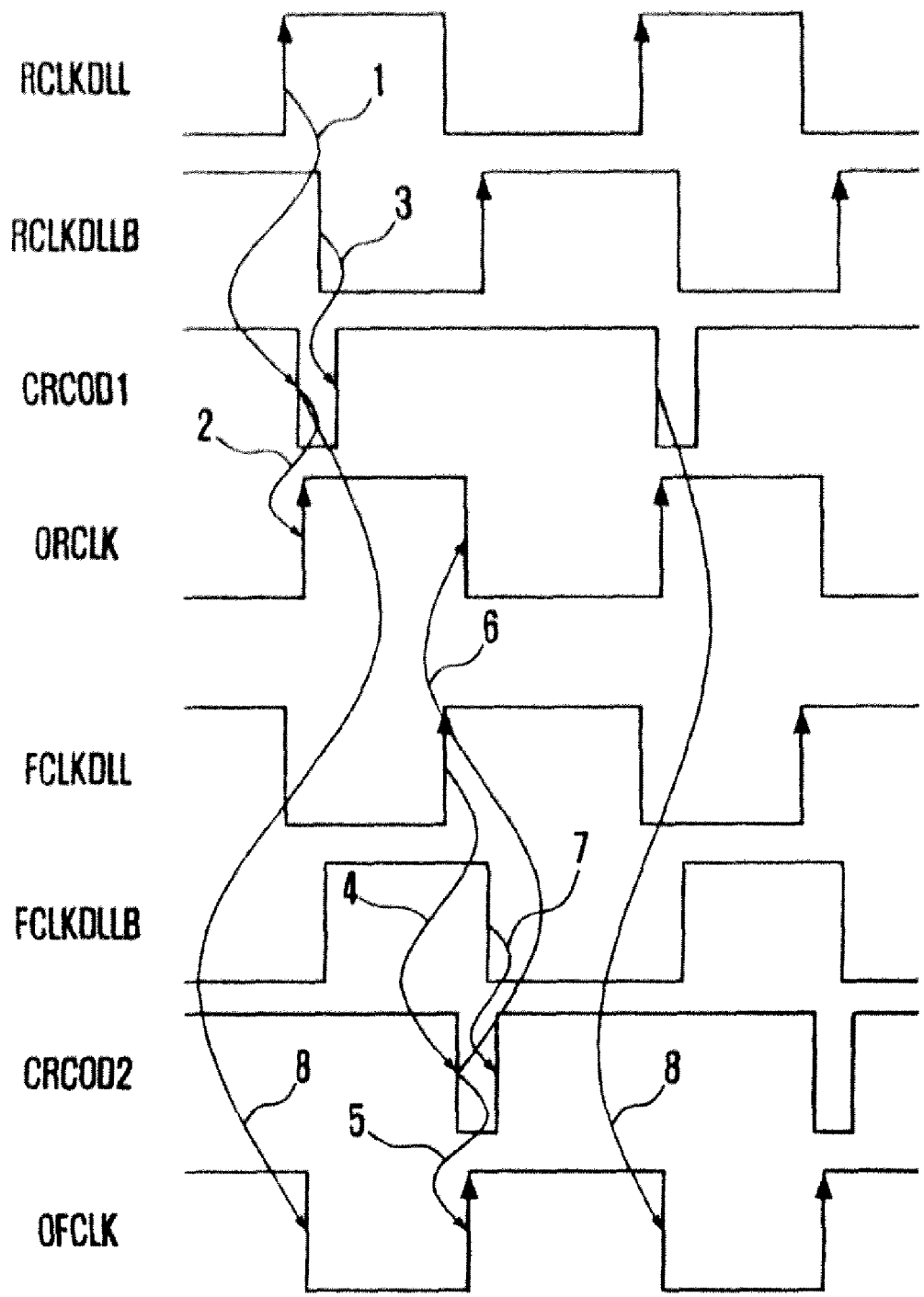
FIG. 4 is a timing diagram of input/output signals in the CRC clock generator in FIG. 3 in accordance with an embodiment of the present invention.

FIG. 4 is a timing diagram of input/output signals in the CRC clock generator 234 in FIG. 3 in accordance with an embodiment of the present invention.

Referring to FIG. 4, it can be appreciated that input signals are the first and second clocks RCLKDLL and FCLKDLL and output signals are the first and second CRC clocks ORCLK and OFCLK. Further, the first clock RCLKDLL has a phase opposite to that of the second clock FCLKDLL.

Specifically, when the first clock RCLKDLL is activated to a logic high level, the first toggling signal CRCOD1 is activated to a logic low level (①) by detecting the activation of the first clock RCLKDLL, and the first CRC clock ORCLK is then activated to a logic high level (②) in response to the activation of the first toggling signal CRCOD1. At the same time when the first CRC clock ORCLK is activated to a logic high level, the second CRC clock OFCLK is deactivated to a logic low level (⑧). After a lapse of a predetermined time, the first toggling signal CRCOD1 is deactivated to a logic high level (③) in response to the output signal RCLKDLLB of the delay DELAY1 which is activated to a logic low level, but the first CRC clock ORCLK maintains its activation state of logic high level because it is latched.

Thereafter, when the second clock FCLKDLL is activated to a logic high level, the second toggling signal CRCOD2 is activated to a logic low level by detecting the activation of the first clock RCLKDLL (④), and the second CRC clock OFCLK is then activated to a logic high level (⑤) in response to the activation of the second toggling signal CRCOD2. At the same time when the second CRC clock ORCLK is activated to a logic high level, the first CRC clock ORCLK is deactivated to a logic low level (⑥). After a lapse of a predetermined time, the second toggling signal CRCOD2 is deactivated to a logic high level (⑦) in response to the output signal FCLKDLLB of the delay DELAY2 which is activated to a logic low level, but the second CRC clock OFCLK maintains its activation state of logic high level because it is latched.

Resultingly, the first and second CRC clocks ORCLK and OFCLK are generated, having activation and deactivation sections opposite to each other.

Figure 5:
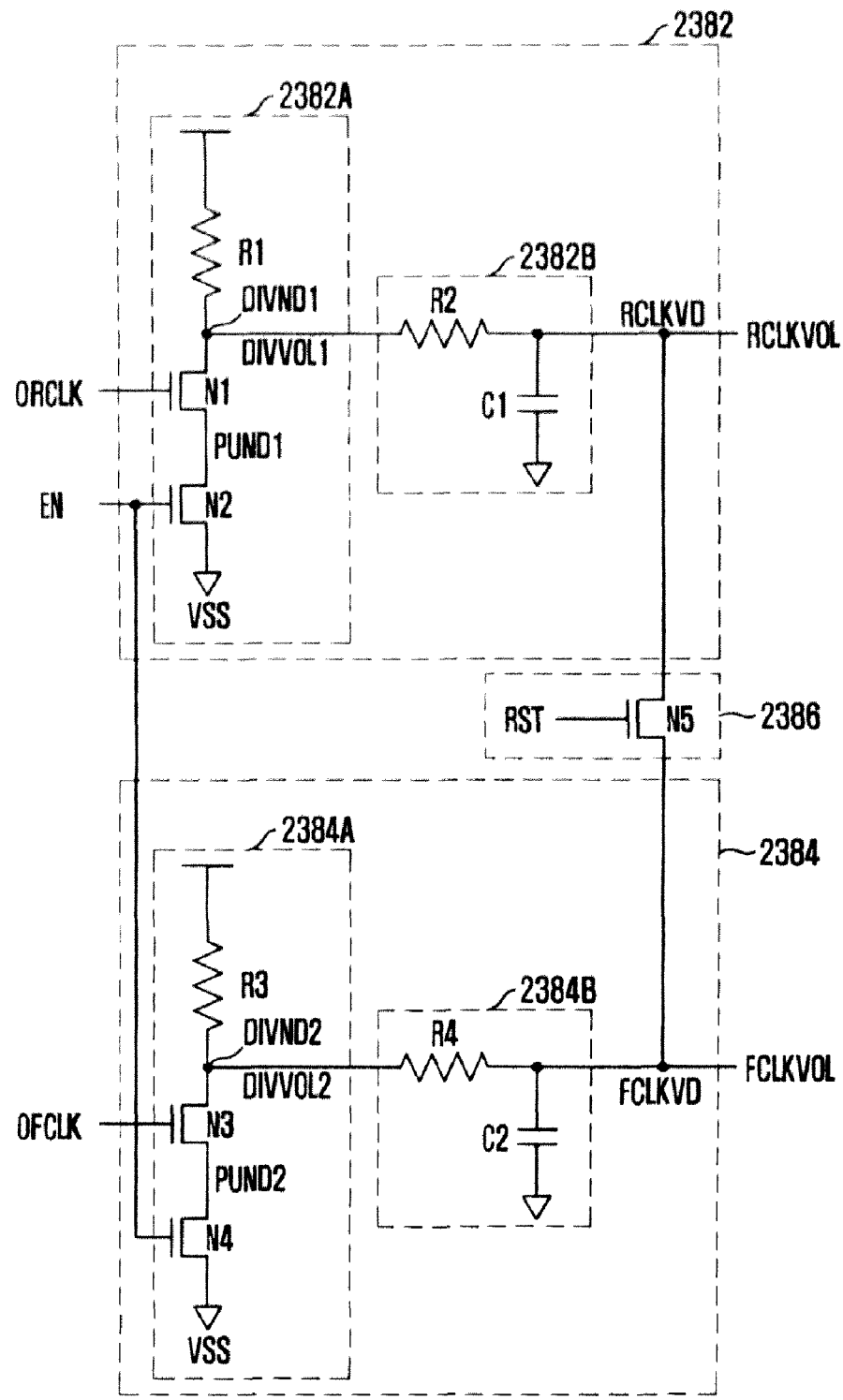
FIG. 5 is a circuit diagram illustrating a voltage level determiner provided in the voltage generation unit of the DLL of the semiconductor device in FIG. 2 in accordance with an embodiment of the present invention.

FIG. 5 is a circuit diagram illustrating the voltage level determiner 238 provided in the voltage generation unit 230 of the DLL of the semiconductor device in FIG. 2 in accordance with an embodiment of the present invention.

Referring to FIG. 5, the voltage level determiner 238 of the voltage generation unit 230 includes a first voltage level determiner 2382, a second voltage level determiner 2384 and an equalization controller 2386. The first voltage level determiner 2382 determines a voltage level of the first voltage RCLKVOL applied to a first voltage output terminal RCLKVD according to a ratio of the activation section to the deactivation section of the first CRC clock ORCLK. The second voltage level determiner 2384 determines a voltage level of the second voltage FCLKVOL applied to a second voltage output terminal FCLKVD according to a ratio of the activation section to the deactivation section of the second CRC clock OFCLK. The equalization controller 2386 controls equalization of the voltage levels of the first and second voltage output terminals RCLKVD and FCLKVD in response to the reset signal RST.

The first voltage level determiner 2382 includes a voltage divider 2382A and a voltage level mixer 2382B. The voltage divider 2382A divides the power voltage VDD at a first division ratio to generate a division voltage DIVVOL1 during the activation section of the first CRC clock ORCLK, and divides the power voltage VDD at a second division ratio to generate the division voltage DIVVOL1 during the deactivation section of the first CRC clock ORCLK. The voltage level mixer 2382B mixes the voltage level of the division voltage DIVVOL1 generated during the activation section of the first CRC clock ORCLK and the voltage level of the division voltage DIVVOL1 generated during the deactivation section, thereby determining a level of the first voltage RCLKVOL.

The voltage divider 2382A includes a first resistor R1, a first NMOS transistor N1 and a second NMOS transistor N2, which are connected in series between the power voltage (VDD) terminal and the ground voltage (VSS) terminal. The first NMOS transistor N1 is configured with a drain terminal connected to a division node DIVND1, a source terminal connected to a pull-down node PUND1, and a gate receiving the first CRC clock ORCLK. The first NMOS transistor N1 controls the voltage level of the division voltage DIVVOL1 to be changed by varying the amount of current flowing through a drain-source path between the division node DIVND1 and the pull-down control node PUND1 depending on a duty ratio of the first CRC clock ORCLK. The second NMOS transistor N2 is configured with a drain terminal connected to the pull-down node PUND1, a source terminal connected to the ground voltage (VSS) terminal, and a gate receiving the enable signal EN.

The voltage level mixer 2382B of the first voltage level determiner 2382 includes a second resistor R2 connected to the division node DIVND1 in series and a capacitor C1 connected to the division node DIVND1 in parallel, so that the voltage level of the division voltage DIVVOL1 is changed at a rate corresponding to a predetermined time constant ($\tau$).

That is, the first voltage level determiner 2382 controls the voltage level of the first voltage RCLKVOL to be relatively low in the case where the activation section of the first CRC clock ORCLK is relatively longer than the deactivation section, and controls the voltage level of the first voltage RCLKVOL to be relatively high in the case where the deactivation section of the first CRC clock ORCLK is relatively longer than the activation section.

The second voltage level determiner 2384 includes a voltage divider 2384A and a voltage level mixer 2384B. The voltage divider 2384A divides the power voltage VDD at a first division ratio to generate a division voltage DIVVOL2 during the activation section of the second ID CRC clock OFCLK, and divides the power voltage VDD at a second division ratio to generate the division voltage DIVVOL2 during the deactivation section of the second CRC clock OFCLK. The voltage level mixer 2384B mixes the voltage level of the division voltage DIVVOL2 generated during the activation section of the second CRC clock OFCLK and the voltage level of the division voltage DIVVOL2 generated during the deactivation section, thereby determining a level of the second voltage FCLKVOL.

The voltage divider 2384A includes a first resistor R3, a first NMOS transistor N3 and a second NMOS transistor N4, which are connected in series between the power voltage (VDD) terminal and the ground voltage (VSS) terminal. The first NMOS transistor N3 is configured with a drain terminal connected to a division node DIVND2, a source terminal connected to a pull-down node PUND2, and a gate receiving the second CRC clock OFCLK. The first NMOS transistor N3 controls the voltage level of the division voltage DIVVOL2 to be changed by varying the amount of current flowing through a drain-source path between the division node DIVND2 and the pull-down control node PUND2 depending on a duty ratio of the second CRC clock OFCLK. The second NMOS transistor N4 is configured with a drain terminal connected to the pull-down node PUND1, a source terminal connected to the ground voltage (VSS) terminal, and a gate receiving the enable signal EN.

The voltage level mixer 2384B of the second voltage level determiner 2384 includes a second resistor R4 connected to the division node DIVND2 in series and a capacitor C2 connected to the division node DIVND2 in parallel, so that the voltage level of the division voltage DIVVOL2 is changed at a rate corresponding to a predetermined time T0 constant (t).

That is, the second voltage level determiner 2384 controls the voltage level of the second voltage FCLKVOL to be relatively low in the case where the activation section of the second CRC clock FRCLK is relatively longer than the deactivation section, and controls the voltage level of the second voltage FCLKVOL to be relatively high in the case where the deactivation section of the second CRC clock FRCLK is relatively longer than the activation section.

The equalization controller 2386 includes an NMOS transistor N5 configured with a drain terminal connected to the first voltage output terminal RCLKVD, a source terminal connected to the second voltage output terminal FCLKVD, and a gate receiving the reset signal RST.

Figure 6:
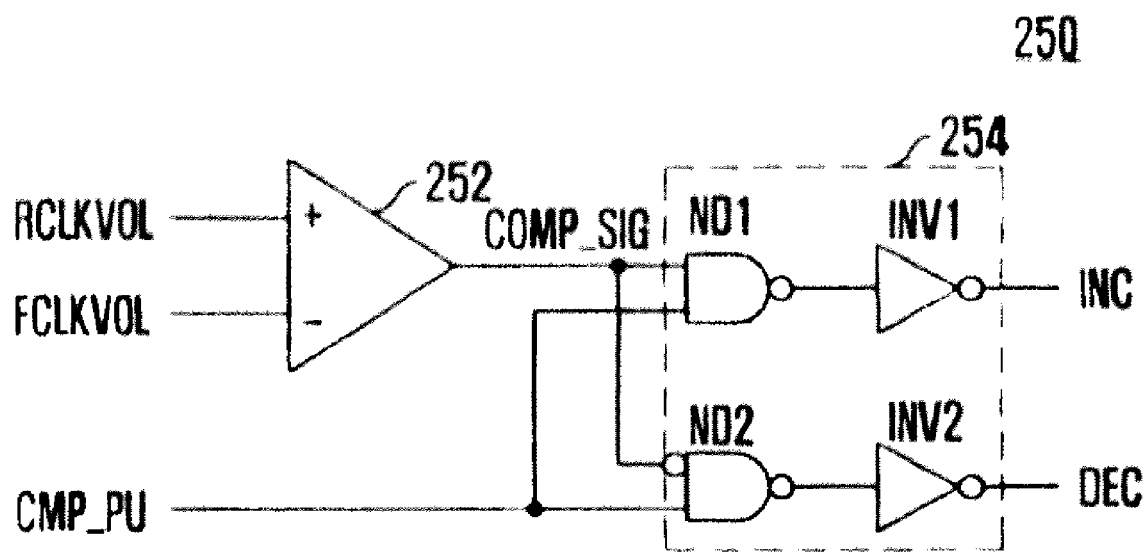
FIG. 6 is a circuit diagram illustrating a voltage comparison unit in the DLL of the semiconductor device in FIG. 2 in accordance with an embodiment of the present invention.

FIG. 6 is a circuit diagram illustrating the voltage comparison unit 250 in the DLL of the semiconductor device in FIG. 2 in accordance with an embodiment of the present invention.

Referring to FIG. 6, the voltage comparison unit 250 includes a comparator 252 and an increase/decrease signal output unit 254. The comparator 252 compares the level of the first voltage RCLKVOL applied though a first input terminal, e.g., positive terminal, and the level of the second voltage FCLKVOL applied through a second input terminal, e.g., negative terminal, thereby outputting a comparison signal COMP_SIG. The increase/decrease signal output unit 254 activates one of an increase signal INC and a decrease signal DEC in response to the comparison signal COMP_SIG when the comparison control signal CMP_PU is activated.

Herein, the increase/decrease output unit 254 includes a first and second NAND gates ND1 and ND2, and first and second inverters INV1 and INV2. The first NAND gate ND1 performs a NAND operation on the comparison signal COMP_SIG and the comparison control signal CMP_PU. The first inverter INV1 receives an output signal of the first NAND gate ND1 to output the increase signal INC. The second NAND gate ND2 performs a NAND operation on an inversion signal of the comparison signal COMP_SIG and the comparison control signal CMP_PU. The second inverter INV2 receives an output signal of the second NAND gate ND2 to output the decrease signal DEC.

Figure 7:
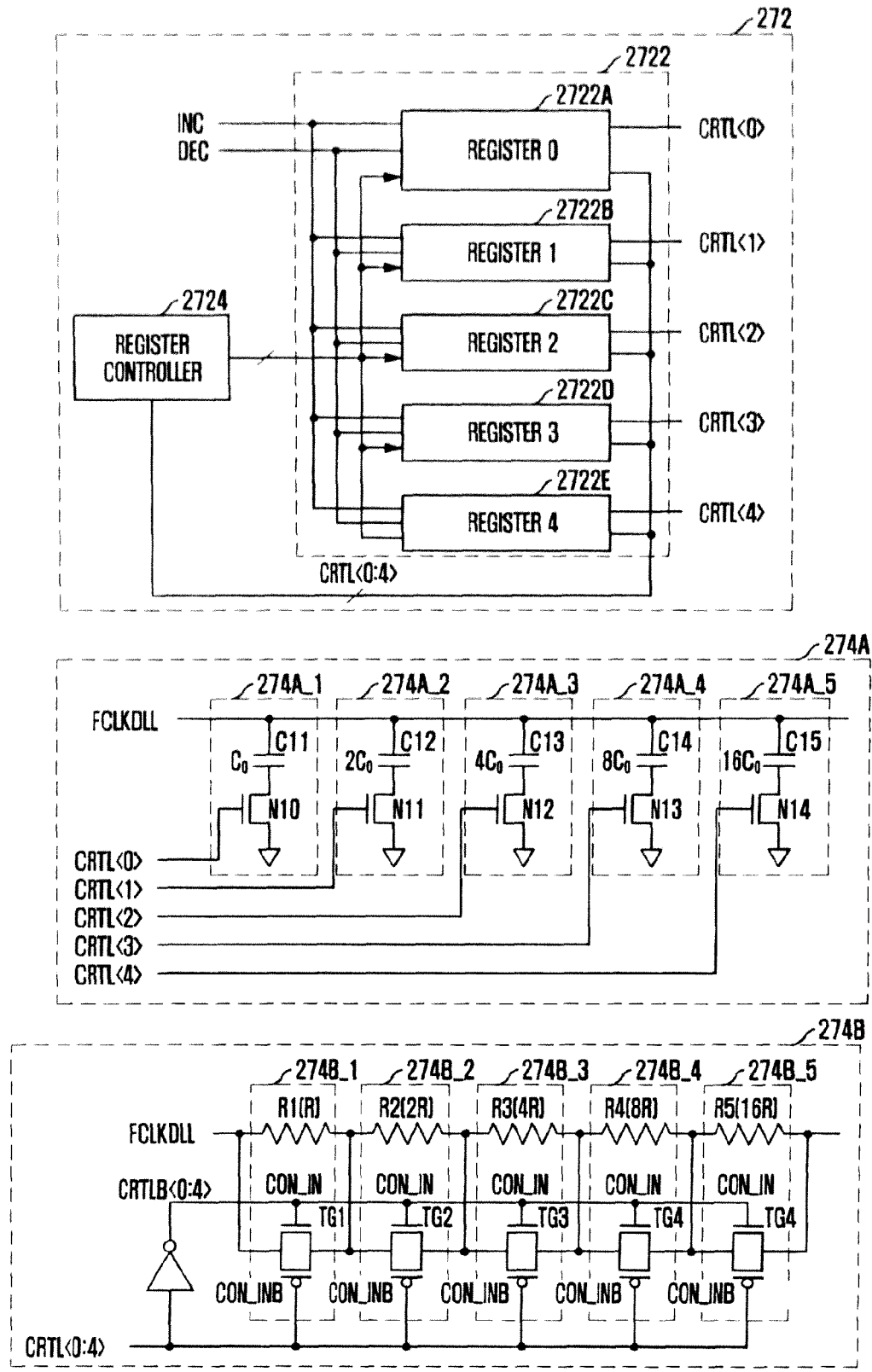
FIG. 7 is a circuit diagram illustrating a clock delay unit in the DLL of the semiconductor device in FIG. 2 in accordance with an embodiment of the present invention.

FIG. 7 is a circuit diagram illustrating the clock delay unit 270 in the DLL of the semiconductor device in FIG. 2 in accordance with an embodiment of the present invention.

Referring to FIG. 7, the clock delay unit 270 includes a data storage 272 and first and second delays 274A and 274B. The data storage 272 stores data CRTL<0:4> having predetermined initial values. The data storage 272 increases the values of the stored data CRTL<0:4> at a predetermined ratio in response to the increase signal INC outputted from the voltage comparator 250, and decreases the values of the stored data CRTL<0:4> at a predetermined ratio in response to the decrease signal DEC. The first and second delays 274A and 274B receive one of the first and second clocks RCLKDLL and FCLKDLL, for example, the second clock FCLKDLL in FIG. 7 to thereby delay the received clock of which delay amount is changed corresponding to the values of the data CRTL<0:4> stored in the data storage 272.

The first delay 274A includes a plurality of delay components 274A_1, 274A_2, 274A_3, 274A_4 and 274A_5 which are series-connected to a terminal of one of the first and second clocks RCLKDLL and FCLKDLL, and the second delay 274B also includes a plurality of delay components 274B_1, 274B_2, 274B_3, 274B_4 and 274B_5 which are series-connected to an input terminal of one of the first and second clocks RCLKDLL and FCLKDLL. In FIG. 7, each delay component 274A_1, 274A_2, 274A_3, 274A_4, 274A_5, 274B_1, 274B_2, 274B_3, 274B_4 and 274B_5 is series-connected to the terminal of the second clock FCLKDLL, for example. The respective delay components 274A_1, 274A_2, 274A_3, 274A_4, 274A_5, 274B_1, 274B_2, 274B_3, 274B_4 and 274B_5 are controlled such that they are independently turned on/off corresponding to the values of the data CRTL<0:4> stored in the data storage 272.

The delay components 274A_1, 274A_2, 274A_3, 274A_4 and 274A_5 in the first delay 274A respectively includes capacitors C11, C12, C13, C14 and C15 and NMOS transistors N10, N11, N12, N13 and N14, which are connected in series between the terminal of one of the first and second clocks RCLKDLL and FCLKDLL (for example, the second clock FCLKDLL in FIG. 7) and the ground voltage (VSS) terminal. The capacitors C11, C12, C13, C14 and C15 have predetermined capacitances, respectively. Each of the NMOS transistors N10, N11, N12, N13 and N14 is configured with a drain terminal connected to each capacitor C11, C12, C13, C14 and C15, a source terminal connected to the ground voltage (VSS) terminal, and a gate receiving a corresponding one of the data CRTL<0:4> stored in the data storage 272.

The delay components 274B_1, 274B_2, 274B_3, 274B_4 and 274B_5 in the second delay 274B respectively includes resistors R1, R2, R3, R4 and R5 and transfer gates TG1, TG2, TG3, TG4 and TG5, which are parallel-connected to the terminal of one of the first and second clocks RCLKDLL and FCLKDLL. The resistors R1, R2, R3, R4 and R5 have predetermined resistances, respectively. Each of the transfer gates TG1, TG2, TG3, TG4 and TG5 controls input and output terminals of each of the resistors R1, R2, R3, R4 and R5 to be connected to each other in response to the data CRTL<0:4> stored in the data storage 272 which are applied to control input terminals CON_IN and CON_INB.

Figure 8:
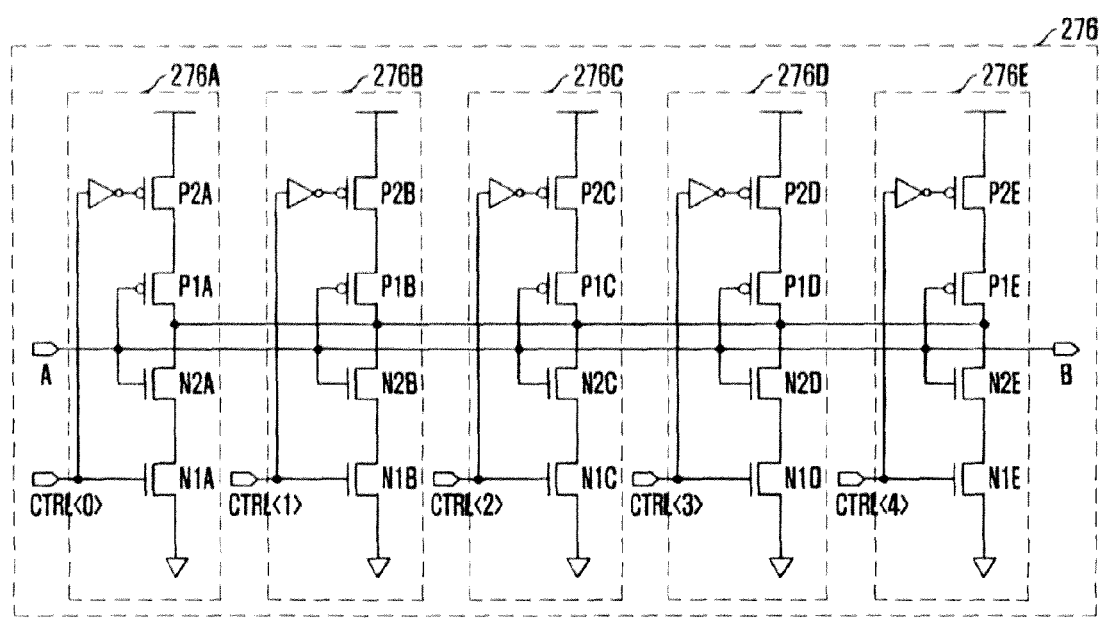
FIG. 8 is a circuit diagram illustrating the clock delay unit 270 in accordance with another embodiment of the present invention.

FIG. 8 is a circuit diagram illustrating the clock delay unit 270 in accordance with another embodiment of the present invention. Referring to FIG. 7, the clock delay unit 270 includes a data storage 272 and a clock driver 276. Since the data storage 272 has the same as the above-described structure, its detailed description will be omitted.

The clock driver 276 drives the clock transferred through one (the second clock FCLKDLL in FIG. 7) of the first clock (RCLKDLL) terminal and the second clock (FCLKDLL) terminal, and its drivability is changed according to the value of data CTRL<0:4> stored in the data storage 272. The clock driver 276 includes a plurality of driving units 276A, 276B, 276C, 276D and 276E that are parallel-connected to one of the first clock (RCLKDLL) terminal and the second clock (FCLKDLL) terminal. The driving units are independently turned on/off according to the data CTRL<0:4> stored in the data storage 272.

The driving units 276A, 276B, 276C, 276D and 276E may have the same or different drivability. As illustrated in FIG. 8, the driving units 276A, 276B, 276C, 276D and 276E may be implemented with inverters having the same or different size.

More specifically, in case where the driving units 276A, 276B, 276C, 276D and 276E are implemented with inverters, the inverters includes first PMOS and NMOS transistors, and second PMOS and NMOS transistors. The first PMOS transistors P1A, P15, P1C, P1D and P1E and to the first NMOS transistors N1A, N1B, N1C, N1D and N1E inverts the clock received through one of the first clock (RCLKDLL) terminal and the second clock (FCLKDLL) terminal with a predefined drivability. The second PMOS transistors P2A, P2B, P2C, P2D and P2E and the second NMOS transistors N2A, N2B, N2C, N2D and N2E controls the on/off operations of the inverters in response to the data CTRL<0:4> stored in the data storage 272, respectively.

The sizes of the inverters 276A, 276B, 276C, 276D and 276E can be different by making the first and second transistors N1A, N1B, N1C, N1D, N1E, N2A, N2B, N2C, N2D and N2E and the first and second PMOS transistors P1A, P1B, P1C, P1D, P1E, P2A, P2B, P2C, P2D and P2E have different width and length.

For example, the inverters 276A 276B, 276C, 276D and 276E may be made to have the same length and different width as follows.

When the current drivability ratio of the NMOS transistor to the PMOS transistor is 2, the first and second NMOS transistors N1A and N2A of the first inverter 276A have the width of "1W" and the first and second PMOS transistors P1A and P2A of the first inverter 276A have the width of "2W". The first and second NMOS transistors N1B and N2B of the second inverter 276B have the width of "2W" and the first and second PMOS transistors P18 and P2B of the second inverter 2768 have the width of "4W". The first and second NMOS transistors N1C and N2C of the third inverter 276C have the width of "4W" and the first and second PMOS transistors P1C and P2C of the third inverter 276C have the width of "8W". The first and second NMOS transistors N1D and N2D of the fourth inverter 276D have the width of "8W" and the first and second PMOS transistors P1D and P2D of the fourth inverter 276D have the width of "16W". The first and second NMOS transistors N1E and N2E of the fifth inverter 276E have the width of "16W" and the first and second PMOS transistors P1E and P2E of the fifth inverter 276E have the width of "32W".

In this case, the first and second NMOS transistors N1A and N2A and the first and second PMOS transistors P1A and P2A of the first inverter 276A are turned on/off according to the data CTRL<0> among the data CTRL<0:4> stored in the data storage 272. The first and second NMOS transistors N1B and N2B and the first and second PMOS transistors P1B and P2B of the second inverter 276B are turned on/off according to the data CTRL<1>. The first and second NMOS transistors N1C and N2C and the first and second PMOS transistors P1C and P2C of the third inverter 276C are turned on/off according to the data CTRL<2>. The first and second NMOS transistors N1D and N2D and the first and second PMOS transistors P1D and P2D of the fourth inverter 276D are turned on/off according to the data CTRL<3>. The first and second NMOS transistors N1E and N2E and the first and second PMOS transistors P1E and P2E of the fifth inverter 276E are turned on/off according to the data CTRL<4>. Accordingly, the drivability of the clock driver 276 to drive one of the first clock (RCLKDLL) terminal and the second clock (FCLKDLL) terminal may be different according to the data CTRL<0:4> stored in the data storage 272.

Figure 9:
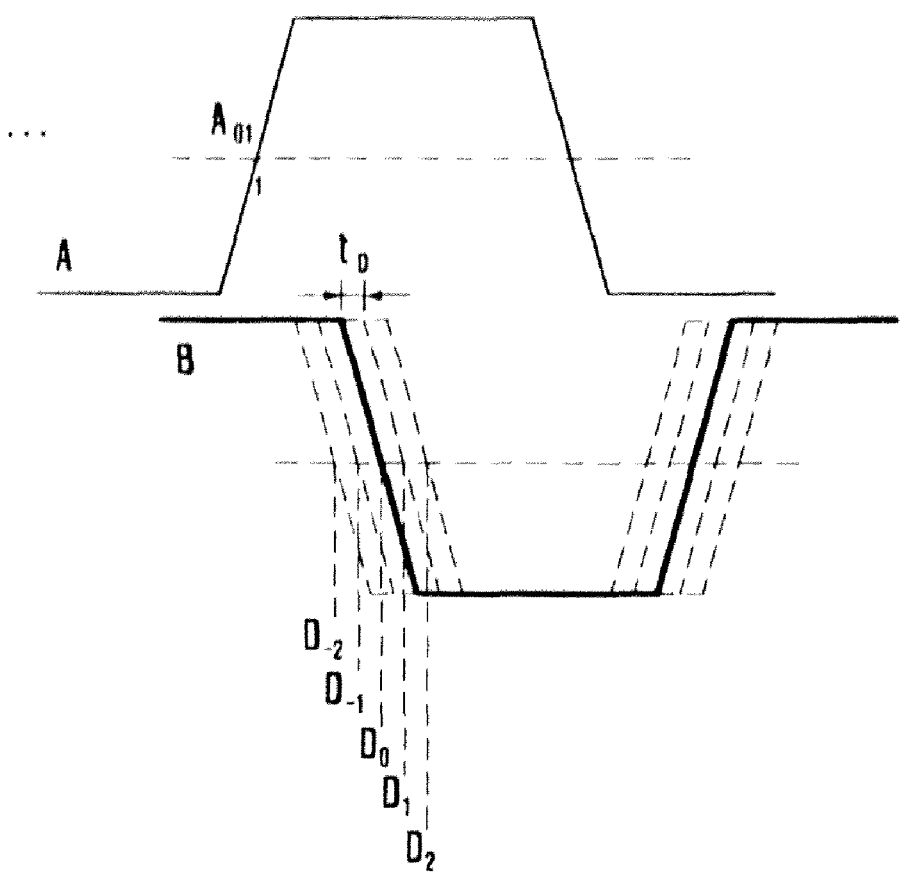
FIG. 9 is a timing diagram illustrating the operation of a clock driver of the clock delay unit of FIG. 8.

FIG. 9 is a timing diagram illustrating the operation of the clock driver of the clock delay unit of FIG. 8.

Referring to FIG. 9, the driving units 276A, 276B, 276C, 276D and 276E of the clock driver 276 in the clock delay unit 270 are implemented with the inverters as illustrated in FIG. 8, and a reference symbol "A" represents the clock input to the inverters 276A, 276B, 276C, 276D and 276E. Delay amounts of the clocks "B" output from the inverters 276A, 276B, 276C, 276D and 276E are changed according to the data CTRL<0:4> stored in the data storage 272.

More specifically, assuming that an initial value of the data CTRL<0:4> stored in the data storage 272 is "1000", an initial delay value of the clock "B" output from the inverters 276A, 276B, 276C, 276D and 276E is "D0".

In this state, if the data CTRL<0:4> stored in the data storage 272 is changed to "01111", the delay value of the clock "B" output from the inverters 276A, 2766, 276C, 276D and 276E is "D1" that is greater than "D0".

If the data CTRL<0:4> stored in the data storage 272 is changed to "01110", the delay value of the clock "B" output from the inverters 276A, 2766, 276C, 276D and 276E is "D2" that is greater than "D1".

On the other hand, if the data CTRL<0:4> stored in the data storage 272 is changed to "10001", the delay value of the clock "B" output from the inverters 276A, 276B, 276C, 276D and 276E is "D−1" that is less than "D0".

If the data CTRL<0:4> stored in the data storage 272 is changed to "10010", the delay value of the clock "B" output from the inverters 276A, 276B, 276C, 276D and 276E is "D−2" that is less than "D−1".

Since the drivability of the clock driver 276 is changed according to the data CTRL<0:4> stored in the data storage 272, the clock transferred through the first clock (RCLKDLL) terminal or the second clock (FCLKDLL) terminal connected to the clock delay unit 270 is delayed according to the changed drivability.

Operation of the DLL of the semiconductor device in accordance with the embodiment of the present invention will be described in detail below.

Figure 1:
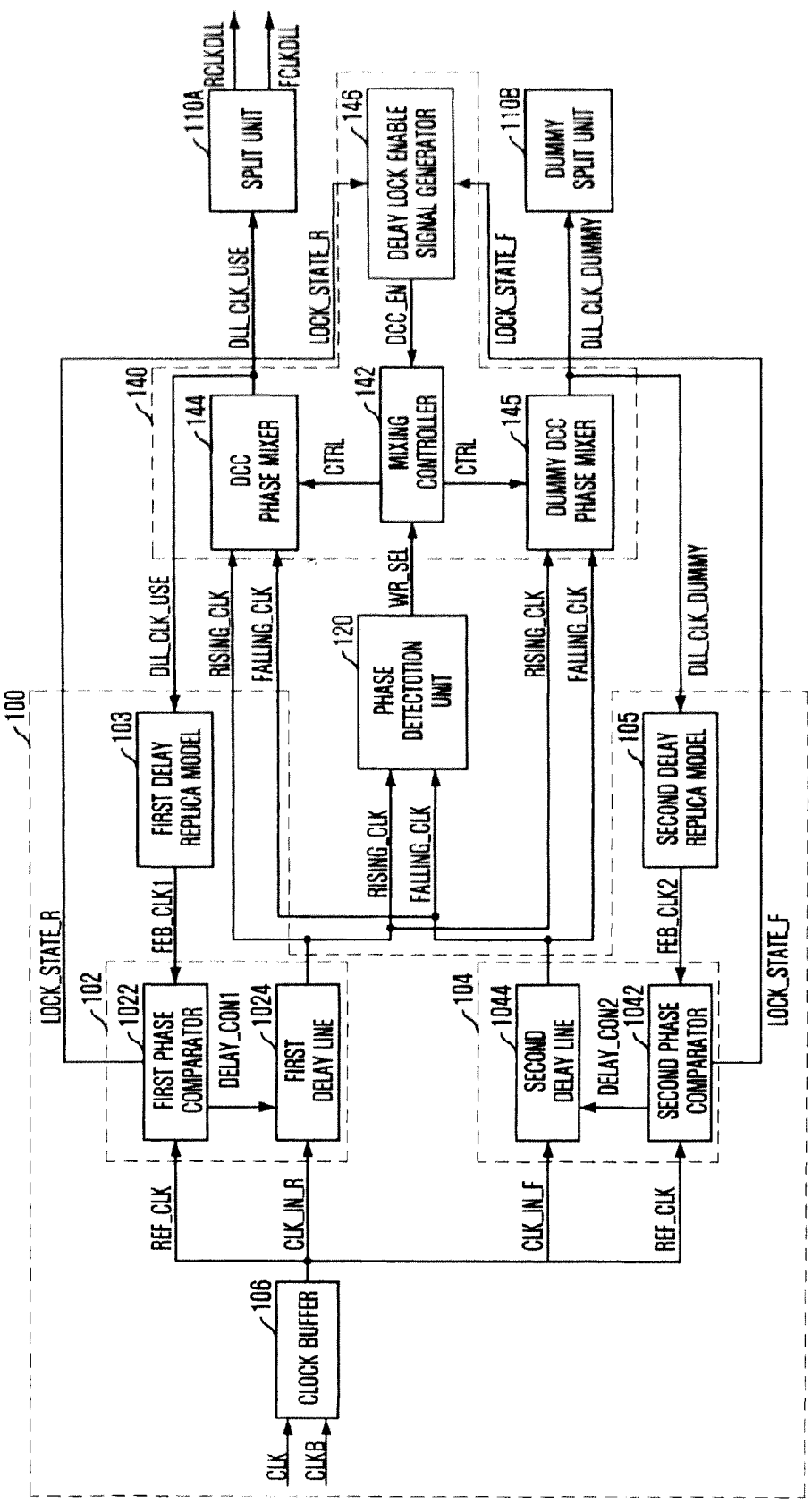
FIG. 1 is a block diagram illustrating a conventional delay locked loop (DLL) of a semiconductor device.

The delay locking unit 200 shown in FIG. 2 employs a single loop, and its operation is very similar to the operation in the before-delay-locked state of the conventional DLL employing a dual loop, which has already been described in FIG. 1.

That is, the inventive DLL employs the method of appropriately adjusting the delay amount of the delay line 204 such that the internal clock CLK_IN initially synchronized with the reference clock REF_CLK can be re-synchronized even after it is delayed by the delay replica model 203 by a predetermined delay time. Therefore, the DLL clock DLL_CLK is synchronized with a clock edge, e.g., rising edge or falling edge, of the reference clock REF_CLK.

Thereafter, the split unit 210 receives the DLL clock DLL_CLK to split the DLL clock DLL_CLK into the first clock corresponding to the first edge, e.g., rising edge, and the second clock FCLKDLL corresponding to the second edge, e.g., falling edge. The first edge of the DLL clock DLL_CLK may be a rising edge and the second edge may be a falling edge, and vice versa. Since the first and second edges are opposite to each other, the first and second clocks RCLKDLL and FCLKDLL have opposite phases to each other.

Figure 10:
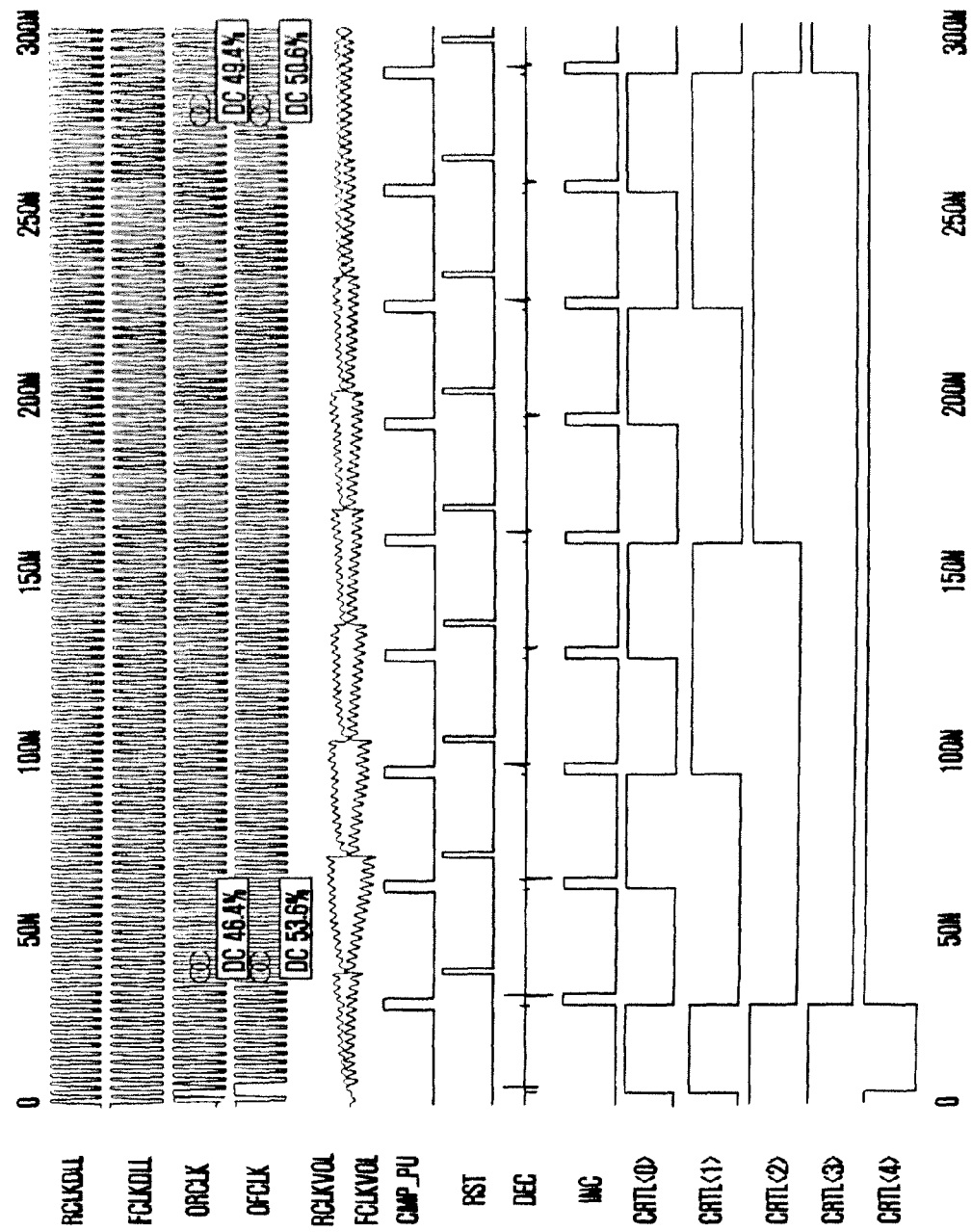
FIG. 10 is a timing diagram of input/output signals in the DLL of the semiconductor device in accordance with the embodiment of the present invention.

FIG. 10 is a timing diagram of input/output signals in the DLL of the semiconductor device in accordance with an embodiment of the present invention.

Referring to FIG. 10, as described above, it can be appreciated that the first and second clocks RCLKDLL and FCLKDLL outputted from to the split unit 210 are toggling with phases opposite to each other.

Specifically, the CRC clock generator 234 of the voltage generation unit 230 receives the first clock RCLKDLL to generate the first CRC clock ORCLK, and receives the second clock FCLKDLL to generate the second CRC clock OFCLK.

Comparing waveforms of the first and second clocks RCLKDLL and FCLKDLL generated initially with those of the first and second CRC clocks ORCLK and OFCLK, it can be appreciated that the first and second CRC clocks ORCLK and OFCLK are equal to the first and second clocks RCLKDLL and FCLKDLL except that the first and second CRC clocks ORCLK and OFCLK are delayed by predetermined times with respect to the first and second clocks RCLKDLL and FCLKDLL.

However, the most significant difference between the first and second clocks RCLKDLL and FCLKDLL and the first and second CRC clocks ORCLK and OFCLK is as followings. In the first and second clocks RCLKDLL and FCLKDLL, the delay amount required for delaying a clock itself is changed. That is, in the first and second clocks RCLKDLL and FCLKDLL, the output simply comes out earlier or later depending on the delay time with the constant ratio of the activation section to the deactivation section. However, the first and second CRC clocks ORDLK and OFCLK differ from the first and second clocks RCLKDLL and FCLKDLL in that the ratio of the activation section to the deactivation section is changed depending on changes in the first and second clocks RCLKDLL and FCLKDLL.

Therefore, the duty ratio of the first and second clocks RCLKDLL and FCLKDLL that was not 50 to 50 initially cannot be 50 to 50 even after a lapse of time. However, the first edge, e.g., rising edge, of the first ID clock RCLKDLL differs in a point of time from the first edge, e.g., rising edge, of the second clock FCLKDLL. That is, assuming that a time taken from the first edge of the first clock RCLKDLL to the first edge of the second clock FCLKDLL is referred to as a first time and a time taken from the first edge of the second clock FCLKDLL to the first edge of the first clock RCLKDLL is referred to as a second time, a ratio of the first time to the second time becomes close to approximately 50 to 50 with the lapse of time though it was not 50 to 50 in the initial stage.

The first time corresponds to the activation section of the first CRC clock ORCLK and the deactivation section of the second CRC clock OFCLK, and the second time corresponds to the deactivation section of the first CRC clock ORCLK and the activation section of the second CRC clock OFCLK.

From actual simulation results as shown in FIG. 8, it can be understood that the duty ratios of the first and second clocks RCLKDLL and FCLKDLL are not changed but the duty ratios of the first and second CRC clocks ORCLK and OFCLK are changed.

Specifically, while a ratio of the activation section to the deactivation section of the first CRC clock ORCLK is 46.4% in the initial operation, it can be observed that the ratio of the activation section to the deactivation section of the first CRC clock ORCLK increases to 49.4% after the lapse of a predetermined time.

Likewise, while a ratio of the activation section to the deactivation section of the second CRC clock OFCLK is 53.6% in the initial operation, it can be observed that the ratio of the activation section to the deactivation section of the second CRC clock OFCLK increases to 50.6% after the lapse of a predetermined time.

In the initial operation where a duty ratio difference between the first and second CRC clocks ORCLK and OFCLK is relatively great, there is a great difference in voltage level between the first and second voltages RCLKVOL and FCLKVOL corresponding to the duty ratios of the first and second CRC clocks ORCLK and OFCLK. However, in the initial operation where the duty ratio difference between the first and second CRC clocks ORCLK and OFCLK is relatively small, it can be observed that there is a small difference in voltage level between the first and second voltages RCLKVOL and FCLKVOL corresponding to the duty ratios of the first and second CRC clocks ORCLK and OFCLK.

The reset signal RST and the comparison control signal CMP_PU are periodically activated to control operations of the voltage generation unit 230 and the voltage comparison unit 250.

It can be appreciated that the increase signal INC and the decrease signal DEC outputted from the voltage comparison unit 250 are also activated appropriately according to the operation of the DLL. Although it is illustrated that the activation section of the increase signal INC is longer than that of the decrease signal DEC, the activation section of the decrease signal DEC may be longer than that of the increase signal INC according to the duty ratios of the first and second CRC clocks ORCLK and OFCLK.

Similarly, it can be understood that the output signals CRTL<0:4> of the data storage 272 for controlling the delay amount of the clock delay unit 270 are also activated appropriately according to the operation of the DLL. In view of the waveform, the output signal CRTL<0:4> of the data storage 272 is affected by the increase signal INC rather than the decrease signal DEC, and they may be changed according to the duty ratios of the first and second CRC clocks ORCLK and OFCLK.

As described above, by using an inventive method of correcting the duty ratio at a point of time of splitting the DLL clock, it is possible to correct the duty ratio of the DLL clock DLL_CLK at approximately 50 to 50 although the semiconductor device employs the DLL operating in single loop manner that has a simpler configuration than the conventional DLL operating in dual loop manner.

While the conventional DLL had to employ a dual loop inevitably for correcting a duty ratio, the application of the inventive DLL operating in single loop manner enables an occupation area of the DLL to be relatively decreased in the semiconductor device. This makes it easy to miniaturize the semiconductor device.

The DLL employing the dual loop consumes more current than the DLL employing the single loop. However, the DLL of the present invention operates in single loop manner, and thus DLL can operate with relatively small current. Consequently, when the DLL of the present invention with a single loop is applied to the semiconductor device, it is possible to reduce current consumption in the semiconductor device.

In accordance with the present invention as described above, the DLL of the present invention employs a method of correcting a duty ratio of a DLL clock at a point of time when splitting the DLL clock outputted as being delay locked in the DLL, so that the present invention is applicable to the DLL employing a single loop. Hence, in the case of applying this method to the semiconductor device, it is possible to relatively reduce an occupation area of the DLL in the semiconductor device, thus miniaturizing the semiconductor device.

In addition, since the present invention is applicable to the DLL employing the single loop, it is possible to realize the DLL with single loop that operates in the same manner as the DLL with the dual loop even using relatively small amount of current, which reduces the amount of current consumed in the semiconductor device.

While the present invention has been described with respect to the specific embodiments, it will be apparent to those skilled in the art that various changes and modifications may be made without departing from the spirit and scope of the invention as defined in the following claims.

For example, although, in the exemplary embodiments, the first edge is a rising edge and the second edge is a falling edge, the present invention is not limited thereto. That is, in the present invention, the second edge may be a rising edge and the first edge may be a falling edge.

Logic gates and transistors exemplarily illustrated in the aforesaid embodiments may change their locations and kinds depending on polarities of signals.

What is claimed is:

1. A semiconductor device, comprising:
   a split unit configured to receive and split a reference clock to output a first clock corresponding to a first edge of the reference clock and a second clock corresponding to a second edge;
   a voltage generation unit configured to generate a first voltage corresponding to a duty ratio of the first clock and a second voltage corresponding to a duty ratio of the second clock;
   a voltage comparison unit configured to compare a level of the first voltage with a level of the second voltage; and
   a clock delay unit configured to receive one of the first and second clocks to delay the received clock of which delay amount is determined in response to an output signal of the voltage comparison unit.

2. The semiconductor device as recited in claim 1, further comprising an operation control unit configured to generate a reset signal, an enable signal and a comparison control signal, for controlling operations of the voltage generation unit and the voltage comparison unit in response to a delay locked loop (DLL) clock, wherein the operation control unit provides the reset signal and enable signal to the voltage generation unit, and provides the comparison control signal to the voltage comparison unit.

3. The semiconductor device as recited in claim 1, wherein the voltage generation unit includes:
   a CRC clock generator configured to generate a first CRC clock that is activated in response to a first edge of the first clock provided from the split unit and deactivated in response to a first edge of the second clock provided from the split unit, and generate a second CRC clock that is activated in response to the first edge of the second clock and deactivated in response to the first edge of the first clock; and
   a voltage level determiner configured to output the first voltage of which a level is determined corresponding to a duty ratio of the first CRC clock, and a second voltage of which a level is determined corresponding to a duty ratio of the second CRC clock.

4. The semiconductor device as recited in claim 3, wherein the CRC clock generation unit includes:
   a first detector configured to detect the first edge of the first clock provided from the split unit to generate a first toggling signal;
   a second detector configured to detect the first edge of the second clock provided from the split unit to generate a second toggling signal;
   a first CRC clock output unit configured to output the first CRC clock that is activated in response to the first toggling signal and deactivated in response to the second toggling signal; and
   a second CRC clock output unit configured to output the second CRC clock that is activated in response to the second toggling signal and deactivated in response to the first toggling signal.

5. The semiconductor device as recited in claim 4, wherein the first detector includes:
   a delay configured to delay the first clock by a predetermined delay time and invert a phase of the first clock; and
   a NAND gate configured to perform a NAND operation on the first clock and an output clock of the delay to output the first toggling signal.

6. The semiconductor device as recited in claim 4, wherein the second detector includes:
   a delay configured to delay the second clock by a predetermined delay time and invert a phase of the second clock; and
   a NAND gate configured to perform a NAND operation on the second clock and an output clock of the delay to output the second toggling signal.

7. The semiconductor device as recited in claim 4, wherein the first CRC clock output unit includes:
   a PMOS transistor comprising a source terminal connected to a power voltage terminal, a drain terminal connected to a CRC clock output terminal, and a gate receiving the first toggling signal;
   a first NMOS transistor comprising a drain terminal connected to the CRC clock output terminal, a source terminal connected to a pull-down control node, and a gate receiving the first toggling signal;
   a second NMOS transistor comprising a drain terminal connected to the pull-down control node, a source terminal connected to a ground voltage terminal, and a gate receiving an inversion signal of the second toggling signal; and
   a latch configured to prevent the CRC clock output terminal from floating.

8. The semiconductor device as recited in claim 4, wherein the second CRC clock output unit includes:
   a PMOS transistor comprising a source terminal connected to a power voltage terminal, a drain terminal connected to a CRC clock output terminal, and a gate receiving the second toggling signal;

a first NMOS transistor comprising a drain terminal connected to the CRC clock output terminal, a source terminal connected to a pull-down control node, and a gate receiving the second toggling signal;
a second NMOS transistor comprising a drain terminal connected to the pull-down control node, a source terminal connected to a ground voltage terminal, and a gate receiving an inversion signal of the first toggling signal; and
a latch configured to prevent the CRC clock output terminal from floating.

9. The semiconductor device as recited in claim 3, wherein the voltage level determiner includes:
a first voltage level determiner configured to determine a level of the first voltage applied to a first voltage output terminal according to a ratio of an activation section to a deactivation section of the first CRC clock provided from the CRC clock generator;
a second voltage level determiner configured to determine a level of the second voltage applied to a second voltage output terminal according to a ratio of an activation section to a deactivation section of the second CRC clock provided from the CRC clock generator; and
an equalization controller configured to control equalization of voltage levels of the first and second voltage output terminals in response to the reset signal.

10. The semiconductor device as recited in claim 9, wherein the first voltage level determiner controls the level of the first voltage to be relatively low when the activation section of the first CRC clock is longer than the deactivation section, and controls the level of the first voltage to be relatively high when the deactivation section of the first CRC clock is longer than the activation section.

11. The semiconductor device as recited in claim 9, wherein the first voltage level determiner includes:
a voltage divider configured to divide a power voltage at a first division ratio to generate a division voltage during the activation section of the first CRC clock, and divide the power voltage at a second division ratio to generate the division voltage during the deactivation section of the first CRC clock; and
a voltage level mixer configured to mix a level of the division voltage generated during the activation section of the first CRC clock and a level of the division voltage generated during the deactivation section of the first CRC clock for determining a level of the first voltage.

12. The semiconductor device as recited in claim 11, wherein the voltage divider includes:
a first resistor;
a first NMOS transistor comprising a drain terminal connected to a division node, a source terminal connected to a pull-down node, and a gate receiving the first CRC clock, wherein the first NMOS transistor controls a level of the division voltage to be changed by varying an amount of current flowing through a drain-source path between the division node and the pull-down control node according to a duty ratio of the first CRC clock; and
a second NMOS transistor comprising a drain terminal connected to the pull-down node, a source terminal connected to the ground voltage terminal, and a gate receiving an enable signal,
the first resistor, the first NMOS transistor and the second NMOS transistor being connected in series between the power voltage terminal and the ground voltage terminal.

13. The semiconductor device as recited in claim 10, wherein the voltage level mixer includes:

a second resistor configured to be connected to the division node in series; and
a capacitor configured to be connected to the division node in parallel,
the level of the division voltage being changed at a rate corresponding to a predetermined time constant ($\tau$).

14. The semiconductor device as recited in claim 9, wherein the second voltage level determiner controls the level of the second voltage to be relatively low when the activation section of the second CRC clock is longer than the deactivation section, and controls the level of the second voltage to be relatively high when the deactivation section of the second CRC clock is longer than the activation section.

15. The semiconductor device as recited in claim 9, wherein the second voltage level determiner includes:
a voltage divider configured to divide a power voltage at a first division ratio to generate a division voltage during the activation section of the second CRC clock, and divide the power voltage at a second division ratio to generate the division voltage during the deactivation section of the second CRC clock; and
a voltage level mixer configured to mix a level of the division voltage generated during the activation section of the second CRC clock and a level of the division voltage generated during the deactivation section of the second CRC clock for determining a level of the second voltage.

16. The semiconductor device as recited in claim 15, wherein the voltage divider includes:
a first resistor;
a first NMOS transistor comprising a drain terminal connected to a division node, a source terminal connected to a pull-down node, and a gate receiving the first CRC clock, wherein the first NMOS transistor controls a level of the division voltage to be changed by varying an amount of current flowing through a drain-source path between the division node and the pull-down control node according to a duty ratio of the second CRC clock; and
a second NMOS transistor comprising a drain terminal connected to the pull-down node, a source terminal connected to the ground voltage terminal, and a gate receiving an enable signal,
the first resistor, the first NMOS transistor and the second NMOS transistor being connected in series between the power voltage terminal and the ground voltage terminal.

17. The semiconductor device as recited in claim 15, wherein the voltage level mixer includes:
a second resistor configured to be connected to the division node in series; and
a capacitor configured to be connected to the division node in parallel,
the level of the division voltage being changed at a rate corresponding to a predetermined time constant ($\tau$).

18. The semiconductor device as recited in claim 9, wherein the equalization controller includes an NMOS transistor including a drain terminal connected to the first voltage output terminal, a source terminal connected to the second voltage output terminal, and a gate receiving the reset signal.

19. The semiconductor device as recited in claim 1, wherein the voltage comparison unit includes:
a comparator configured to compare a level of the first voltage applied from the voltage generation unit through a first input terminal with a level of the second voltage applied from the voltage generation unit through a second input terminal to output a comparison signal; and an increase/decrease signal output unit configured to activate and output one of an increase signal and a decrease signal in response to the comparison signal when the comparison control signal is activated.

20. The semiconductor device as recited in claim 1, wherein the clock delay unit includes:
   a data storage configured to store data having a predetermined initial value, and increase or decrease a value of the data at a predetermined ratio in response to output signal of the voltage comparison unit; and
   a delay configured to receive one of the first and second clocks provided from the split unit to delay the received clock of which delay amount is changed according to the value of the data stored in the data storage.

21. The semiconductor device as recited in claim 20, wherein the delay includes a plurality of delay components configured to be series-connected to a terminal of one of the first and second clocks, each of the delay components being independently turned on/off according to the value of the data value stored in the date storage.

22. The semiconductor device as recited in claim 21, wherein the delay component includes:
   a capacitor having predetermined capacitance; and
   an NMOS transistor comprising a drain terminal connected to the capacitor, a source terminal connected to the ground voltage terminal, and a gate receiving the data stored in the data storage,
   the capacitor and the NMOS transistor being series-connected between the terminal of one of the first and second clocks and the ground voltage terminal.

23. The semiconductor device as recited in claim 21, wherein the delay component comprises:
   a resistor having predetermined resistance; and
   a transfer gate configured to control input and output terminals of the resistor to be connected in response to the value of the data stored in the data storage that is applied to control input terminals,
   the resistor and the transfer gate being parallel-connected to the terminal of one of the first and second clocks.

24. The semiconductor device as recited in claim 1, wherein the clock delay unit includes:
   a data storage configured to store data having a predetermined initial value, and increase or decrease a value of the data at a predetermined ratio in response to an output signal of the voltage comparison unit; and
   a clock driver configured to drive one of the first clock and the second clock, the drivability of the clock driver being changed according to the value of the data stored in the data storage.

25. The semiconductor memory device as recited in claim 24, wherein the clock driver includes a plurality of driving units that are parallel-connected to one of the a first clock terminal and a second clock terminal, the plurality of driving units being independently turned on/off according to the data stored in the data storage.

26. The semiconductor memory device as recited in claim 25, wherein the driving units have a different drivability.

27. The semiconductor memory device as recited in claim 25, wherein the driving units includes inverters having a different size.

* * * * *